United States Patent [19]
Davison et al.

[11] Patent Number: 5,997,963
[45] Date of Patent: Dec. 7, 1999

[54] MICROCHAMBER

[75] Inventors: John E Davison, Woodside; Kurt W Weiner, San Jose, both of Calif.

[73] Assignee: Ultratech Stepper, Inc., San Jose, Calif.

[21] Appl. No.: 09/073,057

[22] Filed: May 5, 1998

[51] Int. Cl.[6] .................................................. C23C 16/00
[52] U.S. Cl. .................... 427/582; 427/248.1; 118/722; 118/729; 118/733; 355/30; 355/53
[58] Field of Search .................... 118/722, 729, 118/733; 355/30, 53; 427/255.5, 582

[56] References Cited

U.S. PATENT DOCUMENTS

| | | | |
|---|---|---|---|
| 4,048,955 | 9/1977 | Anderson | 118/49.5 |
| 4,459,104 | 7/1984 | Wollman | 432/123 |
| 4,543,059 | 9/1985 | Whang et al. | 432/11 |
| 5,016,561 | 5/1991 | Tokai et al. | 118/718 |
| 5,064,367 | 11/1991 | Philipossian | 432/253 |
| 5,443,860 | 8/1995 | Wilkinson | 427/248 |
| 5,517,943 | 5/1996 | Takahashi | 118/715 |
| 5,552,017 | 9/1996 | Jang et al. | 156/643.1 |
| 5,558,717 | 9/1996 | Zhao et al. | 118/715 |
| 5,578,131 | 11/1996 | Ye et al. | 118/723 |
| 5,645,417 | 7/1997 | Smith | 432/152 |

*Primary Examiner*—Richard Bueker
*Attorney, Agent, or Firm*—Allston L. Jones

[57] ABSTRACT

The invented apparatus is a relatively small-volumed chamber useful for processing a substrate. The apparatus includes a reference member with a substantially flat surface. The apparatus also includes a stage member with a surface that supports the substrate, and that has a gas bearing surrounding this support surface. Gas flows through the bearing are regulated to generate a seal of the substrate from ambient gases upon bringing the gas bearing close to the reference member's flat surface. The seal generated by the gas bearing can also be used to contain process gas in proximity to the substrate. Such process gas can be introduced into and exhausted from the chamber through an inlet and outlet, respectively, defined in the reference member. The apparatus can include a window fixed in the reference member. Patterned light or a particle beam can be directed through the window to the contained substrate to cause selective reactions to occur thereon. The gas bearing allows the stage member to be moved relative to the reference member without affecting their relative spacing. Therefore, patterns formed on the substrate can be stepped and repeated without the need for significant refocusing of lithography equipment used to form a pattern on the substrate. The invention also includes a related method.

48 Claims, 7 Drawing Sheets

MICROCHAMBER

BACKGROUND OF THE INVENTION

1. Field of the Invention

This invention is directed to a process chamber used to contain inert or reactive process gases for carrying out one or more process steps on a wafer substrate. For example, the process chamber can be used to contain gas reactants for steps such as etching, doping, or growing materials in a process for making integrated electronic, optical or micromechanical devices on the wafer substrate, or for the performance of micromachining, for example. The chamber can also be used to contain an inert gas for a process step that does not require a reactive atmosphere, such as the exposure of a resist layer.

2. Description of the Related Art

Because of their relatively large volume, typically on the order of a few liters or more, previously developed process chambers are generally required to be filled with far more reactant or inert gas than is actually necessary to carry out a particular process step on a wafer substrate. Consequently, such chambers can waste significant amounts of such gases. Also, some gas species are caustic, in which case the relatively large volume of caustic gas required to fill the chamber leads to corrosion of correspondingly large areas of the chamber walls, wafer support surface, piping and other chamber equipment that must be replaced at significant expense. Further, some reactant gas species are toxic, and the accidental release of a large volume of toxic gas from such chambers poses a significant threat to workers in the vicinity of such chamber. Additionally, disposal of large volumes of caustic, toxic or pollutant process gases raises significant health and environmental issues. Furthermore, such large-volume process chambers require significant time to purge and fill with reactant gases, which lowers the wafer throughput of processed wafer substrates attainable with such chambers. It would be desirable to overcome these disadvantages of previous process chambers.

Also of relevance to the subject invention is another problem existing in previous stepper lithography equipment used to pattern devices on a wafer substrate. In the use of such stepper equipment, the wafer stage is repeatedly moved by increments (or in other words 'stepped') relative to lithography projection equipment, and a pattern is exposed on the substrate after each increment of movement. In general, because stage movement relative to the lithography equipment causes the wafer's top surface to move out-of-focus with respect to the lithography equipment, refocusing is necessary after stepping the stage. Such refocusing consumes time and thus lowers the throughput that could otherwise be attained if such refocusing were not necessary. It would be desirable to overcome this disadvantage of previous stepper equipment.

SUMMARY OF THE INVENTION

This invention overcomes the above-noted disadvantages. An apparatus in accordance with this invention includes a relatively small-volumed chamber that seals a wafer substrate from ambient air, and within which the wafer substrate can be processed in a reactive or inert process gas atmosphere. The apparatus includes a reference member having a substantially flat surface, and a stage member that has a surface for supporting the wafer substrate. The stage member is situated in close proximity to oppose, but is spaced apart from, the reference member's surface. To make possible this close, yet spaced, arrangement of the stage and reference members, the stage member has a gas bearing that surrounds the surface that supports the wafer substrate. The gas bearing seals the wafer substrate in the chamber that is defined between the surfaces of the reference and stage members, and by the gas bearing itself. Preferably, the suction generated by the gas bearing is sufficient to load or bias the stage member against the reference member so that the stage member tends to adhere to the reference member without actually making contact therewith. If the stage member is moved relative to the reference member, the gas bearing allows the stage member to glide along the surface of the reference member at a substantially constant distance therefrom. Thus, the stage member can be moved along the reference member's surface from one position to another without significantly changing the spacing between the stage and reference members. This feature allows the invented apparatus to be used to eliminate or reduce the need to refocus lithography projection equipment upon stepping the wafer substrate from one position to another by relative movement of the stage and reference members.

The reference member preferably defines at least one inlet and outlet that communicate with the chamber sealed by the gas bearing. The inlet and outlet allow process gas to be moved through the sealed chamber. The apparatus can include a pressurized source of process gas communicatively coupled to the inlet to supply such gas thereto. To control the flow rate of process gas into the chamber, the apparatus can include a pressure regulator or flow controller coupled between the process gas source and the inlet. The apparatus can also include an exhaust unit coupled to the outlet, that draws off and disposes of exhaust gases such as reaction by-products derived from the process gas, from the chamber. To control the flow rate out of the chamber, the apparatus can include a regulator coupled between the outlet and the exhaust unit. Preferably, the inlet regulator controls the inlet process gas pressure at slightly above ambient pressure, and the outlet regulator controls the outlet process gas pressure at slightly below ambient pressure. Such pressure regulation allows the process gas to be moved through the apparatus without breaking the seal against ambient air formed between the stage and reference members by the gas bearing, or altering the focus position of the wafer substrate.

In a preferred configuration, the apparatus includes a window in the reference member, through which light can be directed to the wafer substrate. The light can be generated by an illumination source and transmitted with a lithography projection unit through the window to the wafer substrate, for example. The light source and projection unit can be included as elements of the apparatus. The light can be used in a process step to cause a reaction to occur on the wafer substrate. For example, the light can be irradiated to the substrate through the window to cause process gas sealed within the apparatus to react with or diffuse into the wafer substrate. The light can be patterned through the use of a mask reticle, for example, to cause such reaction to occur in selective portions of the substrate. Alternatively, the light can be irradiated through the window to selectively expose a resist layer on the wafer substrate, that can be developed for subsequent selective etching or growth of material on the substrate. These etching or growth process steps, and virtually any other steps required in a process, can be carried out within the chamber sealed by the gas bearing. Importantly, the gas bearing allows the wafer substrate to be moved relative to the reference member so that the window can overlie different areas of the wafer substrate, a feature which is useful in stepper lithography units, for example. The apparatus can include a positioner coupled to the stage member to affect such movement. With the apparatus, light can be irradiated on different areas of the wafer substrate through the window, and yet the distance between the stage and reference members is maintained relatively constant by the gas bearing so that the light does not need to be significantly refocused after moving the stage and reference members relative to one another.

To drive the gas bearing, the apparatus can include pressurized gas and vacuum sources. The pressurized gas source(s) can supply inert gas, clean dry air or a gas that is the same species as the process gas, for example. The gas bearing can be configured to include first, second and third channels defined in the stage member. The first channel surrounds the surface used to support the wafer substrate, the second channel surrounds the first channel, and the third channel surrounds the second channel. The first and third channels are coupled to communicate with their respective gas sources or alternatively, a common gas source, and the second channel is coupled to communicate with the vacuum source. The channels can be defined in the stage member by a plurality of lands that are concentric and circular in configuration. The stage member is held in close proximity to the reference member by suction applied by the vacuum source coupled to the stage member's second channel, and contact between the stage and reference members is prevented by pressurized gas applied by the gas source(s) between the stage and reference members by the first and third channels. To prevent the occurrence of 'air hammer' due to local fluctuations in pressure between the channels, porous lands can be situated in the first and third channels, in which case the second channel is defined between the first and second lands. These porous lands can be made of carbon, which is a relatively soft material that will not damage the reference member's surface if it accidentally contacts the stage member. The porous lands can also be made of ceramic material, for example. By proper control of the gas flows through the gas bearing, the lands can be maintained at a spacing of five to ten microns from the reference member. At such close spacing, the gas flows between the lands and the reference member have relatively high-velocities but low volumes. The high-velocity ensures relatively little if any ambient or contained process gas can pass through the gas bearing. The low volume of such gas flows renders the use of the gas bearing more economical, as relatively little gas is consumed over time in order to drive the gas bearing.

A method in accordance with this invention includes a step of directing a first gas flow from a first surface to a second surface around a first ring-like channel defined in the first surface, that surrounds a wafer substrate situated on the first surface. The first gas flow substantially contains a process gas between the first and second surfaces in proximity to the wafer substrate. The invented method also includes a step of suctioning a second gas flow from between the first and second surfaces around a second ring-like channel defined in the first surface, that surrounds the first channel. The invented method further includes a step of directing a third gas flow from the first surface to the second surface around a third ring-like channel defined in the first surface, that surrounds the second channel. The third gas flow substantially prevents ambient gas from flowing by the third channel. The second gas flow generated by the suctioning step includes at least a portion of the first and third gas flows. Preferably, the suctioning is performed sufficiently to load or bias the first and second surfaces together. Also, to avoid occurrences of air hammer, the first and third flows can be subjected to diffusing steps that divide such flows into relatively small streams or capillary flows that prevent formation of significant local pressure fluctuations. The method can also include a step of directing a process gas into a chamber sealed by the first, second and third gas flows as well as by the first and second surfaces. The method can further include a step of regulating the pressure or flow at which the process gas is introduced to the sealed chamber at slightly above ambient pressure, a pressure which is sufficiently high to cause the gas to flow into the sealed volume, and yet that is not so high as to break the seal generated between the first and second surfaces by the gas flows. The method can also include a step of exhausting the process gas from the sealed volume, a step which can be regulated at slightly below ambient pressure which is sufficient to cause the process gas to be exhausted out of the enclosed volume, and yet which is not so large as to break the seal formed by the gas flows through the bearing or change the focus position. The method can also include a step of irradiating the wafer substrate through a window defined in the second surface to cause a reaction to occur on the wafer substrate. For example, the reaction can cause the contained process gas to react with or diffuse into the wafer substrate, or can selectively cause a chemical change in a resist layer to effect its exposure. Furthermore, the method can include a step of moving the first surface to successive positions relative to the second surface, in which the irradiating step is performed after each successive movement. Due to the gas flows generated by the method's directing and suctioning steps, the first surface is maintained at a substantially constant distance from the second surface in the successive positions. Accordingly, significant refocusing of the light used to irradiate the wafer substrate is unnecessary after moving the first and second surfaces from one relative position to another.

These together with other features and advantages, which will become subsequently apparent, reside in the details of construction and operation as more fully hereinafter described and claimed, reference being made to the accompanying drawings, forming a part hereof, wherein like numerals refer to like parts throughout the several views.

DESCRIPTION OF THE PREFERRED EMBODIMENTS

Figure 1:
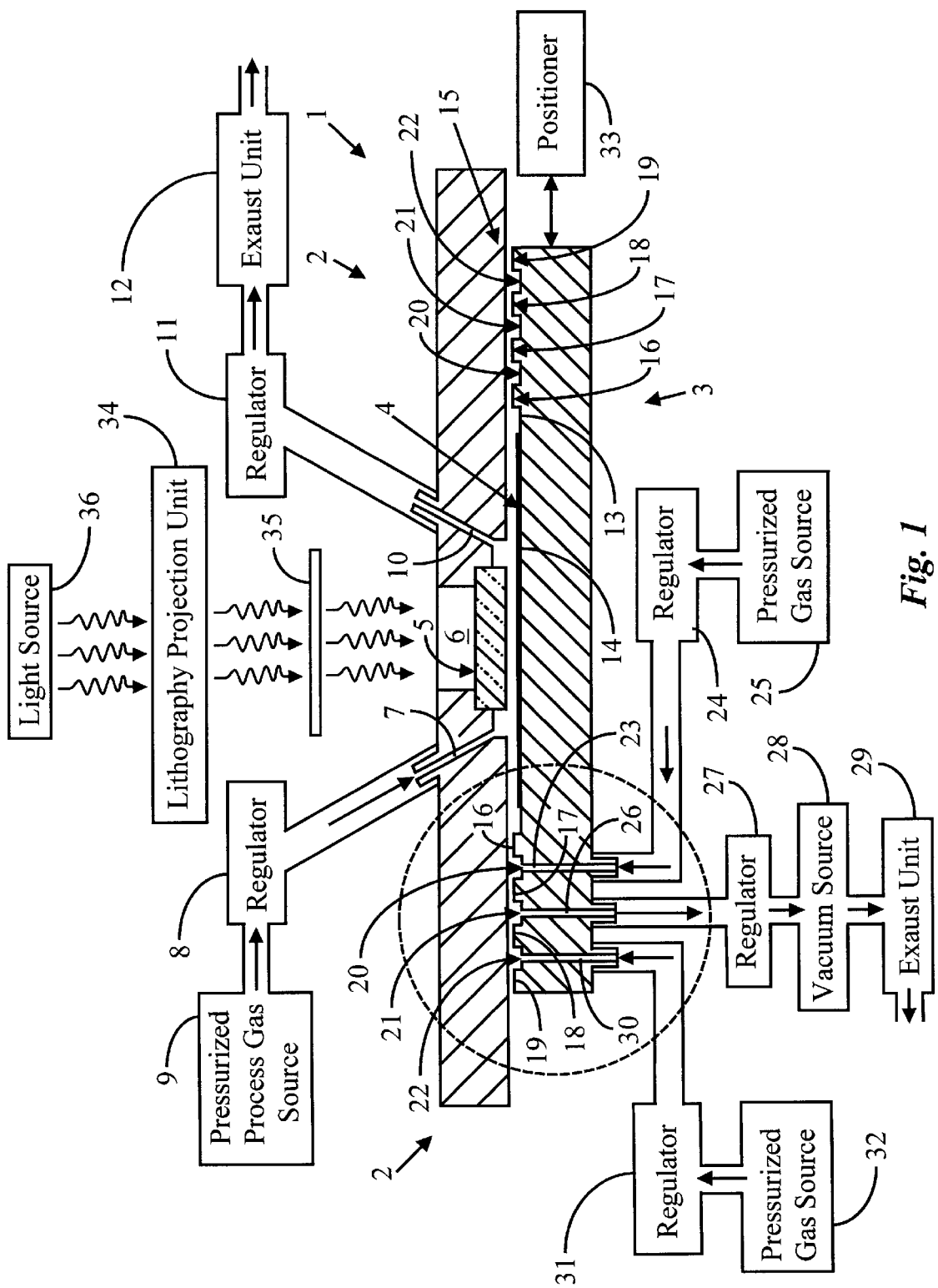
FIG. 1 is a cross-sectional view of a first embodiment of an apparatus in accordance with this invention.

In FIG. 1, a first embodiment of an apparatus 1 of this invention includes a reference member 2 and a stage member 3. The reference and stage members oppose one another, and define a relatively small-volumed process chamber 4 therebetween. The chamber can be used to contain a process or inert gas, and also to seal a wafer substrate positioned within the chamber from ambient air in a manner that will become more apparent hereinafter.

The reference member is preferably composed of a relatively durable, dimensionally stable, chemically inert material such as alumina or appropriate ceramic material. The reference member has a substantially flat surface that opposes the stage member. The reference member's flat surface can be molded, die-cast, machined or otherwise formed to a flatness on the order of microns or less, a feature which is important to maintaining a seal between the stage and reference members and which allows the stage member to move smoothly in a single flat plane along the surface of the reference member.

The apparatus can include a window 5 that is fixed in an aperture 6 defined in the reference member. The window is made of a light- or beam-transparent material such as fused silica, that is molded or cut and polished, for example, to a configuration that fits within the aperture 6. The window 5 can be fixed about its periphery to a seat defined in the reference member. The window can be fixed in its seat with a cement or other adhesive, or with a mechanical seal (not shown), for example.

The reference member also defines an inlet 7 that allows process gas to flow into the apparatus's chamber 4. The apparatus can include a high-precision regulator 8 coupled in communication with the inlet 7, and a pressurized process gas source 9 that is communicatively coupled to the regulator (or flow controller) 8. Such regulator (or flow controller) and pressurized gas source (e.g., a pressurized gas tank) and their use are well-known in this technology. The regulator 8 can be used to control the flow rate of process gas into the chamber. For example, the gas source 9 can be sufficiently pressurized to provide the process gas to the regulator at a pressure on the order of atmospheres or tens of atmospheres. Preferably, the regulator 8 is sufficiently accurate to control the pressure of the process gas supplied to the inlet 7 to within tenths or hundredths of an atmosphere. The reference member 2, regulator 8 and source 9 are communicatively coupled together either directly or through piping, tubing, or the like. The reference member 2, regulator 8 and source 9, any tubing or piping coupled thereto, and all other apparatus elements that are contacted by a reactive process gas, are preferably made of materials that are substantially inert to such gas.

The reference member 2 defines an outlet 10 through which unconsumed process gas, reaction by-products or other exhaust gases are drawn from the apparatus's process chamber 4. Preferably, the outlet 10 is defined on a side of window 5 opposite to that at which the inlet 7 is disposed so that the gas from inlet 7 is drawn across the window 5 where the gas can be reacted by light or particles radiated through the window, if required by a process step that is desired to be implemented in the apparatus. The apparatus can include a regulator (or flow controller) 11 coupled in communication with the outlet 10, and an exhaust unit 12 coupled in communication with the regulator 11. The regulator 11 can be used to control the flow rate of exhaust gases from the chamber, and is preferred to be accurate to within tenths or hundredths of an atmosphere. The exhaust unit 12 can include a burnoff, a scrubber, a disposal tank, or the like, all of which are well-known devices. The exhaust unit 12 can also be equipped with a pump or fan or the like, to assist in drawing exhaust gases from the chamber 4 at a flow rate controlled by the regulator 11. The outlet 10, regulator 11 and exhaust unit 12 can be communicatively coupled together either directly or through appropriate piping, tubing, or the like.

The stage member 3 is made of a durable material such as alumina or ceramic, and can be molded, cast or machined, for example, to an appropriate configuration for use in the apparatus. The stage member can be manufactured according to specification by New Way Machine Components, Inc. of Philadelphia, Pa., for example. The stage member has a substantially flat surface 13 that supports a wafer substrate 14. The wafer support surface 13 of the stage member is preferably formed to a flatness comparable to the opposing surface of the reference member (on the order of microns or less). Preferably, the surface 13 is sufficiently large to accommodate an 8-inch or 12-inch diameter wafer substrate, and yet is not so large as to unnecessarily increase the volume of the chamber 4 so as to avoid waste of process gas supplied to the chamber from the source 9, and so that the chamber can be relatively quickly purged and filled with such gas. As is understood by persons of ordinary skill in this technology, the wafer substrate can be a semiconductor, semiconductor-on-insulator substrate, or some other type of substrate. On the wafer substrate, electronic, mechanical or optical devices can be formed using the gas from source 9 and/or photo- or beam-lithography performed with light or a particle beam irradiated onto the wafer substrate through the window 5.

Importantly, the stage member includes a gas bearing 15 that is formed to surround the stage member's wafer support surface 13. In the embodiment of FIG. 1, the gas bearing 15 includes lands 16, 17, 18, 19 that are defined in the stage member 3. The lands are relatively raised portions of the gas bearing's surface as compared to the surface 13, and are generally raised above the surface 13 to a height of 0.5 to 10 millimeters. The volume of the chamber 4 is thus relatively small, on the order of one liter or less if the land height is 10 millimeters, and less than 0.1 liters for a land height of 0.5 millimeters for 8-inch or 12-inch wafer substrate sizes. The stage member is preferably configured so that the lands have flat annular surfaces that are substantially parallel to the surface 13. This configuration allows the surface 13 to be substantially parallel to the reference member's flat surface so that the wafer substrate's surface will be a constant distance from the overlying window 5 even if the stage member is moved from one position to another along the reference member's surface. As so configured, the wafer substrate can be constrained to move in a single plane parallel to the reference member's surface so that significant refocusing of lithography equipment after relative movement of the stage and reference members is not necessary. The lands 16, 17, 18, 19 are preferably annular or ring-like in configuration, concentric, and, in a direction radially outward from the surface 13, have respective progressively increasing diameters. The lands surround the wafer support surface 13 of the stage member 3. In adjacent areas, the lands define three ring-like channels 20, 21, 22. The lands 16, 17, 18, 19 are preferably each five or more millimeters in radial width, and separated from adjacent lands by spacings of five or more millimeters which define the channels 20, 21, 22. The channel 20 is defined between the lands 16, 17 and is communicatively coupled to an inlet 23 defined in the stage member. The apparatus can include a regulator (or flow controller) 24 coupled in communication with the inlet 23, and a pressurized gas source 25 communicatively coupled to the regulator 24. The gas source 25 preferably supplies inert gas such as nitrogen or dry clean air generated by filtration of dust and condensation of vapor content from ambient air, for example, supplied at a flow rate controlled by the regulator 24. Such filtration and condensation devices are known in this technology, and can include filters, heaters and/or condensers, included as components of the source 25 or as separate accessories for use with such source. Preferably, the gas source 25 is capable of delivering the gas at a pressure of at least 40–80 pounds per square inch (PSI), and the regulator 24 is capable of controlling the pressure at channel 20 to within±1.0 PSI or better.

The channel 21 is defined between the lands 17, 18. The channel 21 communicates with an outlet 26 defined in the stage member 3. For drawing gas from the outlet 26, and hence also from the channel 21, the apparatus can include a regulator (or flow controller) 27, a vacuum source 28, and an exhaust unit 29. The outlet 26 is communicatively coupled to the regulator 27, that is in turn communicatively coupled to the vacuum source 28. The regulator 27 is preferably capable of controlling the pressure at the channel 21 to within±0.1 PSI or better. The vacuum source 28 can be a pump, for example, that suctions gas from the channel at a flow rate determined by the regulator 27. Such pumps are well-known and commercially available. The vacuum source is preferably capable of drawing gas from the channel 21 at a rate that is sufficient to cause the gas bearing to generate a net negative pressure with respect to the ambient pressure, between the stage and reference members. Such negative pressure causes the stage member to be pulled into close proximity to the reference member, while the positive pressures at channels 20, 22 prevent actual contact between the stage and reference members. The vacuum pressure required of the source 28 and the corresponding setting of the regulator 27 are dependent upon the weight of the stage member 3, the configuration of the lands 16, 17, 18, 19, the pressure at which gas is delivered to the gas bearing at channels 20, 22, and the ambient pressure. In general, the vacuum generated by the source 28 must be sufficient to draw off any gas delivered to the channel 21 from adjoining channels 20, 22, and preferably, the vacuum is more than sufficient for this purpose so that the stage member adheres or loads against the reference member 2 without actually making contact therewith. The vacuum source is coupled in communication with the exhaust unit 29 that disposes of gas drawn from the channel 21. Prior to disposal, the exhaust unit can be such as to burnoff, scrub or otherwise condition the gas drawn from the gas bearing 15 so that it is in a nonreactive, non-toxic or other appropriate state prior to its discharge from the unit 29.

The channel 22 is defined between the lands 18, 19. The channel 22 communicates with an inlet 30 defined in the stage member 3. To direct gas to the channel 22 via the inlet 30, the apparatus can include a regulator (or flow controller) 31 and a pressurized gas source 32. The inlet 30 is coupled to communicate with the regulator 31 that is in turn coupled in communication with the pressurized gas source 32. The gas source 32 supplies pressurized gas, preferably inert gas or clean dry air, to the channel 22 via the inlet 30 at a flow rate determined by the regulator 31. The source 32 is preferred to be capable of supplying gas to the channel 22 at a pressure of at least 40–80 PSI, and the regulator 31 is correspondingly set. The regulator 31 is preferred to be capable of controlling the pressure of gas supplied to the channel 22 to within±1.0 PSI or better.

The inlets and outlets 23, 26, 30 are preferably coupled to communicate with respective regulators 24, 27, 31 with flexible piping or tubing and hoseclamps (not shown), whose flexibility allows the stage member to be moved relative to the reference member without interference by such tubing or piping. The regulators 24, 27, 31 can be coupled either directly or through piping or tubing and hoseclamps or the like, to respective sources 25, 28, 32.

Similarly, the vacuum source 28 can be coupled either directly or through piping or tubing and hoseclamps, to the exhaust unit 29.

The apparatus can include a stage positioner 33 coupled to move the stage member 3 between different positions relative to the reference member 2. The positioner can be one of a variety of well-known stage positioning devices. The positioner can be used to move the stage member relative to the reference member so that the window 5 overlies different portions of the wafer substrate.

To affect reactions on the wafer substrate, the apparatus can include a lithography projection unit 34 and light source 36. The lithography projection unit 34 and light source 36 are preferably held in position with respect to the reference member 2 with suitable supports or the like (not shown). The light source 36 generates light for illumination of the wafer substrate 14, that is directed by the source 36 to the lithography projection unit 34. The lithography projection unit 34 transmits the light received from the source 36 to a pattern defined by a mask 35 which selectively blocks and transmits light to generate patterned light. The mask 35 is fixed in position relative to the lithography projection unit 34 and window 5 with suitable supports (not shown). The patterned light travels from mask 35 through the window 5 to the wafer substrate 14. Alternatively, the lithography projection unit 34 can be such that it generates a beam of particles (electrons, for example) that is scanned over the wafer substrate as the positioner 33 moves the stage member 3 relative to the lithography projection unit 34, in which case the mask 35 would not typically be used. The patterned light or beam can be used to selectively induce a reaction on the wafer substrate. An unpatterned beam could be used as well. For example, the light or beam can be such as to induce a process gas contained in the chamber 4 to selectively react with the wafer substrate. In one possible implementation, relatively intense patterned light (such as laser light) or an energetic beam can be used to cause pyrolitic decomposition of process gas adsorbed on or above the wafer substrate so that dissociated process gas atoms diffuse into the substrate in selected areas. Such technique can be used to dope the wafer substrate with n- or p-type process gas atoms, for example. Alternatively, the patterned light can melt the substrate long enough to allow atoms dissociated from the process gas to diffuse into the wafer substrate to achieve selective doping of the wafer substrate. The patterned light or beam could as well be used to pattern a resist layer formed on the wafer substrate 14. Importantly, due to the action of the gas bearing 15, the stage member is constrained to move along the surface of the reference member at a substantially constant distance therefrom. The wafer substrate thus moves only in a single flat plane defined by the reference member's surface. This feature of the invented apparatus is highly advantageous in that, once the lithography projection unit 34 is focused upon the wafer substrate's exposed surface, the stage member can be moved to different positions with respect to the reference member without the need to refocus the lithography projection unit 34. The positioner 33 and lithography projection unit 34 can thus be used to step and expose a pattern over the wafer substrate's surface to produce selective reactions in a stepped array on the wafer substrate. In addition, the gas bearing 15 provides a stable, and in the perspective of FIG. 1, vertically stiff seal between the stage and reference members that renders the apparatus comparatively insensitive to vibration or the like which could otherwise adversely impact the performance of lithography to form devices on the wafer substrate.

Figure 2:
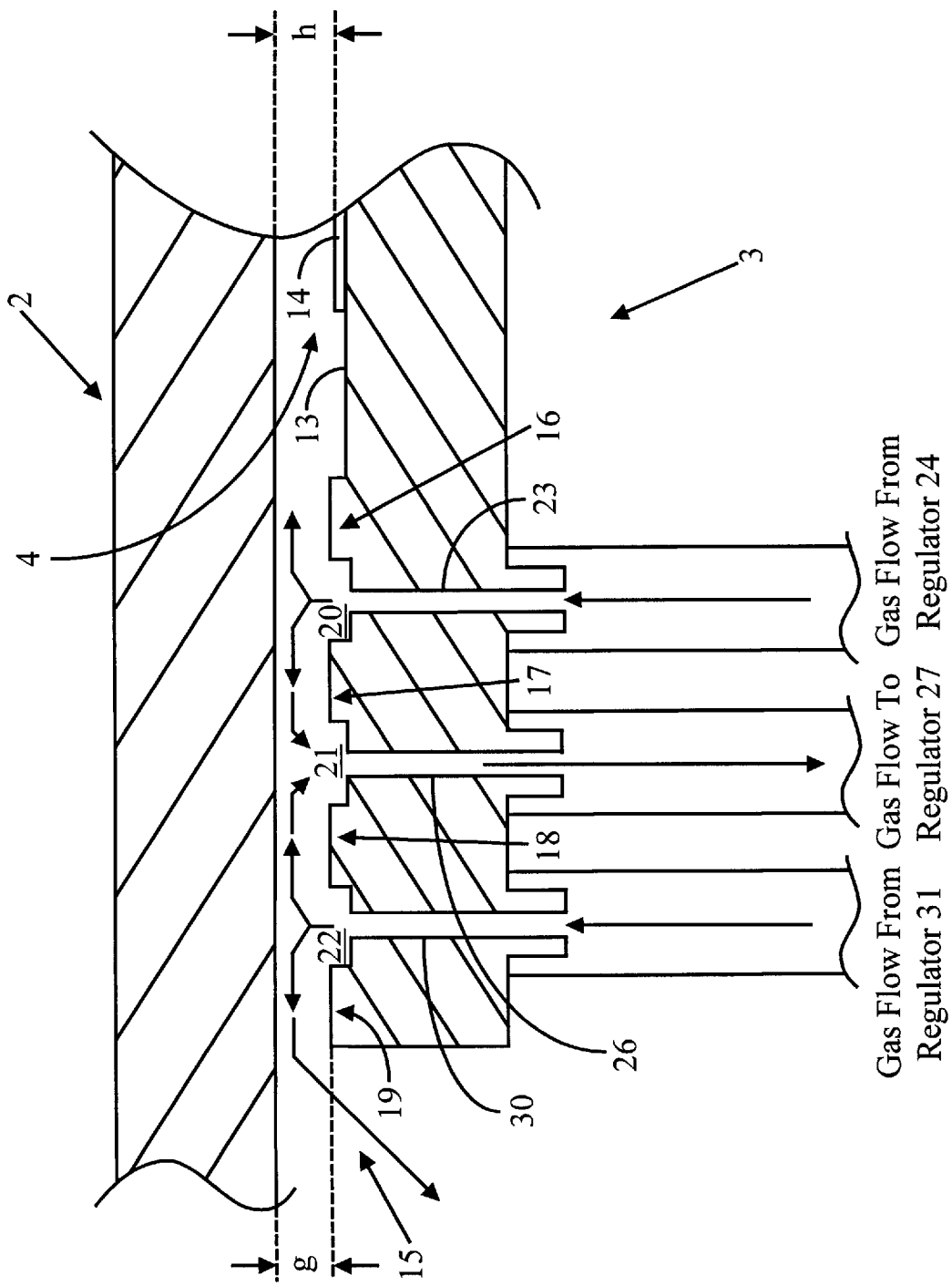
FIG. 2 is a relatively detailed view of a portion of the apparatus of FIG. 1.

FIG. 2 is a more detailed view of a portion of the apparatus 1 that is encircled in broken line in FIG. 1. In FIG.

2, the gas flows into and out of the gas bearing 15 can readily be seen. The gas flow from the inlet 23 into the channel 20 is split and moves over land 16 to the chamber 4, and also over land 17 to the channel 21. The gas species of the flow moving into the chamber 4 is preselected to be one which has no adverse impact on the gas or wafer substrate contained in the chamber 4. The gases flowing in channels 20, 23 can be nitrogen or other inert gas species, or clean dry air, for example. Gas flow from the regulator 31 enters the channel 22 via inlet 30 and is split into flows moving over the land 19 to the ambient environment, and also moving over the land 18 to the channel 21. The outlet 26, and hence also at least part of the channel 21, have a pressure that is at least slightly less than those of the gases entering the channel 21 over lands 17, 18. The outlet 26 thus draws off the gases flowing over the lands 17, 18 into the channel 21. Preferably, the outlet 26 draws off the gases entering the channel 21 at a rate sufficiently high that a negative pressure with respect to ambient develops between the stage and reference members. Such negative pressure tends to bring the stage and reference members together, and yet the pressure exerted by the gases entering the gas bearing from inlets 23, 30 is controlled by respective regulators 24, 31 to be sufficiently high to maintain a spaced relationship between the reference and stage members. Through appropriate control of the gas flows or pressures through the gas bearing 15, the spacing 'g' between the lands and reference member's surface can be made very close, for example, in a range from 5–10 microns wide (the spacing shown in FIGS. 1 and 2 is thus greatly exaggerated). This spacing ensures that the flows over the lands are relatively high-velocity and thus are particularly effective in preventing ambient air from entering the chamber and contained gas from leaving the chamber through the gas bearing 15. In addition, the small spacing between the lands and the reference member's surface ensures that the gas flows have relatively low volumes so that relatively little gas is consumed by the gas bearing over time.

Figure 3:
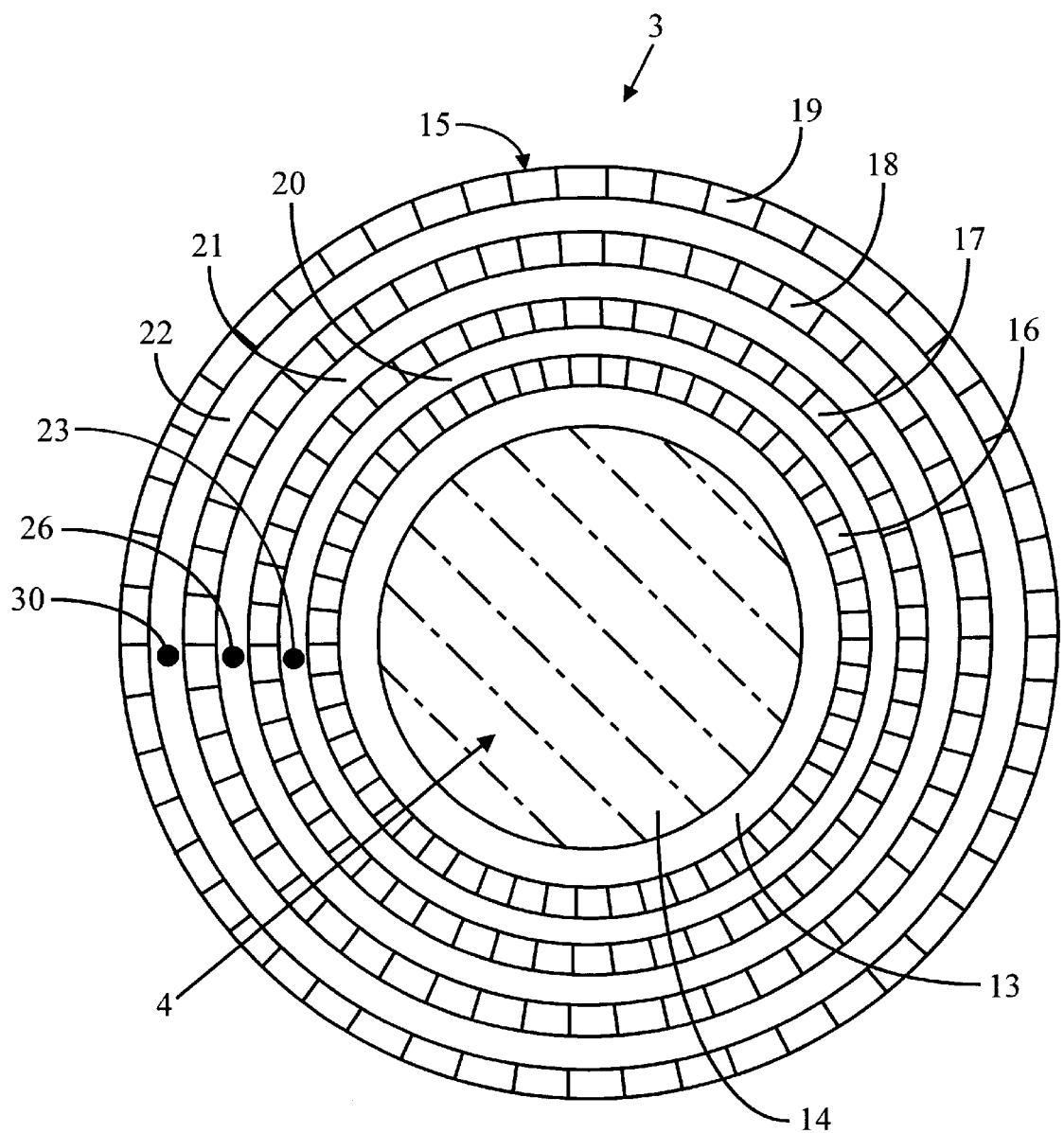
FIG. 3 is a top plan view of a stage member of the apparatus of FIG. 1.

FIG. 3 is a top plan view of the stage member 3 in a preferred configuration thereof. In FIG. 3, the gas bearing 15 includes lands 16, 17, 18, 19 and the channels 20, 21, 22 defined thereby, that are annular and concentric. The gas bearing surrounds the surface 13 that supports the wafer substrate 14. The gas flows into the channels 20, 22 are supplied by the inlets 23, 30, respectively, and the outlet 26 draws gas flow from the channel 21.

The operation of the apparatus 1 is now described with reference to FIGS. 1–3. The wafer substrate 14 is placed on the surface 13 of the stage member 3. The regulators 24, 27, 31 are set to appropriately proportion the gas flows into and out of the gas bearing 15, and the sources 25, 28, 32 are activated. The exhaust unit 29 is likewise activated to condition and dispose of exhaust gases from the gas bearing. Upon bringing the gas bearing close to the reference member 2, the gas flows in the bearing 15 establish a seal between stage and reference members to seal off the process chamber 4 from ambient air. Accordingly, the wafer substrate 14 is sealed from ambient within the process chamber 4, and the upper major surface of the wafer substrate 14 is exposed to the gas contained within the chamber 4. Preferably, the regulators 24, 27, 31 are set, and the sources 25, 28, 32 are such as to generate a net negative pressure that loads the stage member against the reference member.

The regulators 8, 11 are set to generate a desired flow rate for the process gas supplied by the source 9. If such gas is a reactant, the flow rate must be sufficient to ensure that sufficient process gas is available to perform the desired reaction on the wafer substrate at the desired rate. The source 9 is activated, and the process gas is allowed to flow into the chamber 4 at a rate controlled by the regulator 8. Exhaust gases generated by the process gas upon reaction, and unconsumed process gases, are drawn from the chamber 4 at a rate controlled by the regulator 11. The exhaust unit 12 is activated to condition and dispose of the exhaust gases from the chamber 4.

Preferably, the regulator 8 is set to allow the process gas to enter the chamber via inlet 7 at slightly above ambient pressure (e.g., in a range from 1.0 to 1.1 atmosphere), and the regulator 11 is set slightly below ambient pressure (e.g., in a range from 0.9 to 1.0 atmosphere) so that the net pressure experienced by the chamber is relatively close to the ambient pressure. Such settings avoid the formation of a pressure differential across the gas bearing that could affect the stability of its seal. The lithography projection lithography projection unit 34 is activated to irradiate the mask 35 with light which is patterned thereby, and which passes to the wafer substrate 14 through the window 5. The patterned light can cause process gas to selectively react with the substrate. Alternatively, the mask 35 can be omitted and the wafer substrate can be treated uniformly with light or a beam to cause a desired reaction on the substrate. As another alternative, the lithography projection unit 34 can be a beam-generating unit, in which the mask 35 is not generally necessary, and a reaction can be made to selectively occur on the substrate through the use of the beam which can be selectively scanned across the wafer substrate's surface by moving the stage member relative to the reference member with the positioner 33. After exposure of a single area of the wafer substrate 14, the positioner 33 can be used to step the wafer substrate 14 by moving the stage member relative to the reference member. Lithography performed by the lithography projection unit 34 can be repeated after stepping the wafer substrate. By successively stepping and repeating the exposure of the wafer substrate, a plurality of device chips can be formed on the wafer substrate. The apparatus 1 can be used for the performance of an integrated device process step that does not require a reactant process gas. Such a step can include the selective exposure of a pattern on a resist layer formed on the wafer substrate, or a drying or baking step performed by heating the stage or reference member with an electric heating element (not shown), for example. In such a step, the gas source 9 can be used to supply inert process gas to the chamber 4. The lithography projection unit 34 and source 36, and optionally also the mask 35, are used to perform lithography in a manner similar to that previously described.

In yet another alternative implementation, the apparatus 1 can be used in an integrated device processing step that does not require the lithography projection unit 34 and source 36. For example, the gas source 9 can supply an etchant process gas that is directed to the chamber 4 through regulator 8 and inlet 7 to etch the wafer substrate either generally or selectively. Still further, the gas source 9 can supply one or more reactant process gases to the chamber 4 to deposit material, either generally or selectively, through the use of a patterned resist layer, for example, on the wafer substrate. It should now be clear that the apparatus 1 is a highly versatile process chamber.

Figure 4:
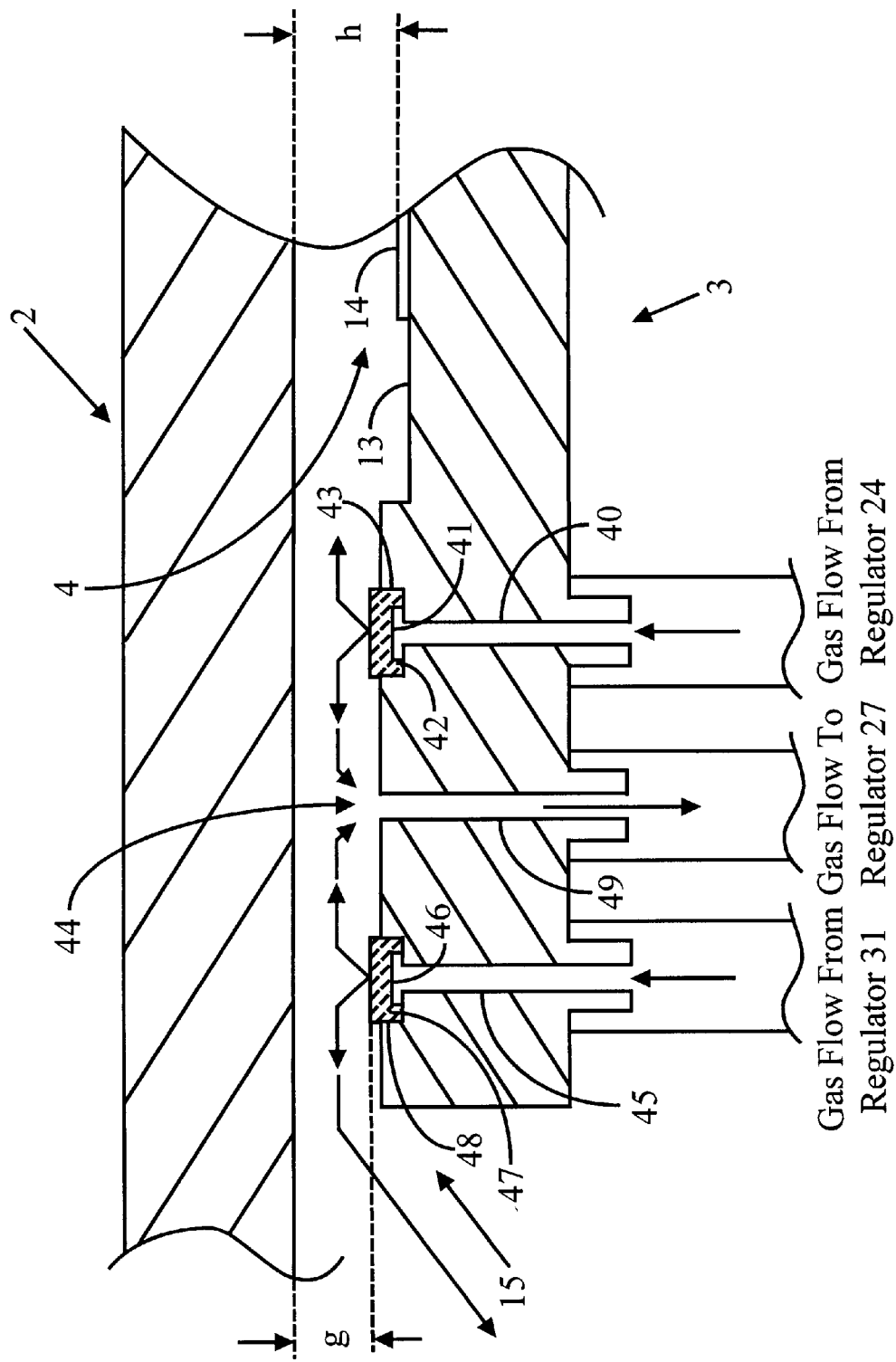
FIG. 4 is a relatively detailed view of a portion a stage member of a second embodiment of the invented apparatus.

FIG. 4 is a second embodiment of the apparatus 1, and is a cross-sectional view showing a portion of the gas bearing 15 having some similarity to FIG. 2 of the first apparatus embodiment. In FIG. 4, the stage member 3 defines an inlet 40 coupled in communication with the regulator 24. The inlet 40 communicates with an annular channel 41 that surrounds the surface 13, and hence the wafer substrate 14 situated thereon. The channel 41 is defined in part by surfaces of a ring-like groove 43 that is defined in the stage member, and that communicates with the inlet 40. The channel 41 is also defined by a ring-like land 42 which is seated in the groove 43, and that has a ring-like recess formed on its underside that defines a portion of the channel 41. The land 42 preferably extends approximately 0.5 to 10 millimeters above the surface 13, and on the order of tenths of millimeters to a few millimeters above the immediately adjacent surfaces of stage member 3, which adjacent surfaces can be elevated above the surface 13, as shown in FIG. 4. The land 42 can be fixed in position to stage member 3 with a cement or adhesive, for example. The land's top surface is preferably substantially flat with a smoothness on the order of microns or less, substantially parallel with surface 13, and at least five millimeters wide. The land 42 can be composed of a porous material such as appropriate forms of carbon or ceramic, for example, that is gas-permeable. The use of carbon to construct the land 42 is advantageous in that carbon is a relatively soft material and will not tend to scratch or damage the reference member 2 if accidentally contacted so that a stable seal can be generated by the gas bearing 15. Due to its porous nature, the land 42 diffuses the gas flow from the channel 41 into many relatively small streams. Such diffuse streams prevent the formation of significant local variations in pressure, and thus prevent the occurrence of 'air hammer,' a phenomenon that would cause the stage member to undesirably rattle or oscillate against the reference member and that would thus likely break the seal desired to be formed by the gas bearing.

The stage member also defines an inlet 45 that is coupled to communicate with the regulator 31. The inlet 45 communicates with a channel 46 that is defined between surfaces of a groove 47 defined in the stage member 3, and a ring-like recess formed on the underside of a porous land 48 composed of a material such as that previously described with respect to the land 42. The land 48 is preferably ring-like in configuration, and is spaced apart from and surrounds the land 42. The lands 42, 48 are preferably spaced from one another by approximately five millimeters to a few centimeters, and define respective inner and outer extremities of channel 44 therebetween. The channel 44 is further defined by a surface that is substantially parallel but elevated relative to the surface 13 of the stage member 3, as shown in FIG. 4. Like the land 42, the land 48 preferably extends approximately 0.5 to 10 millimeters above the surface 13, and on the order of tenths of millimeters to a few millimeters above the surfaces of the reference member 3 immediately adjacent the land 48. The land 48 can be fixed in position to the reference member 3 with a cement or adhesive, for example. The top surface of the land 48 is preferably substantially flat with a smoothness on the order of microns or less, substantially parallel with surface 13, is at least five millimeters wide, and can be composed of a porous material such as appropriate forms of carbon or ceramic, for example. The gas flow from the inlet 45 is distributed about the underside of land 48 via channel 46, and is diffused by the land 48 to generate relatively small flow streams that move between the stage and reference members outwardly to ambient atmosphere in one direction, and that move toward the channel 44 in the other direction. The channel 44 is coupled in communication with the regulator 27 via outlet 49 defined in the stage member. The gas flows from regulators 24, 31 and to regulator 27 are proportioned and controlled by such regulators to generate a gas seal between the stage and reference members. As with the first embodiment, due to the action of the gas bearing 15, the spacing 'g' between the lands 42, 48 and the reference member 2 can be very close, from 5 to 10 microns, for example (the spacing between the reference and stage members is thus greatly exaggerated in FIG. 4 to more clearly show the features of the gas bearing 15). This close spacing ensures high-velocity, low-volume gas flow over the surfaces of lands 42, 48 so that gas contained in chamber 4 generally cannot move against this flow into the gas bearing, and on the other side of the gas bearing, atmospheric gases cannot generally flow against such high-velocity flow by land 48 into the gas bearing. The low-volume flow over the lands 42, 48 ensures that relatively little gas from sources 24, 31 is consumed over time so that the cost of operating the apparatus is relatively low. In addition, because the lands 42, 48 only extend to a height of about 0.5 to 10 millimeters above the surface 13, the volume of the chamber 4 is relatively small, on the order of a liter or less, and with appropriate configurations, can be made to be on the order of 0.1 liter or less. Accordingly, relatively little process gas is needed to completely fill the chamber, and the chamber can be purged and filled with process gas quickly with relatively little waste thereof.

Figure 5:
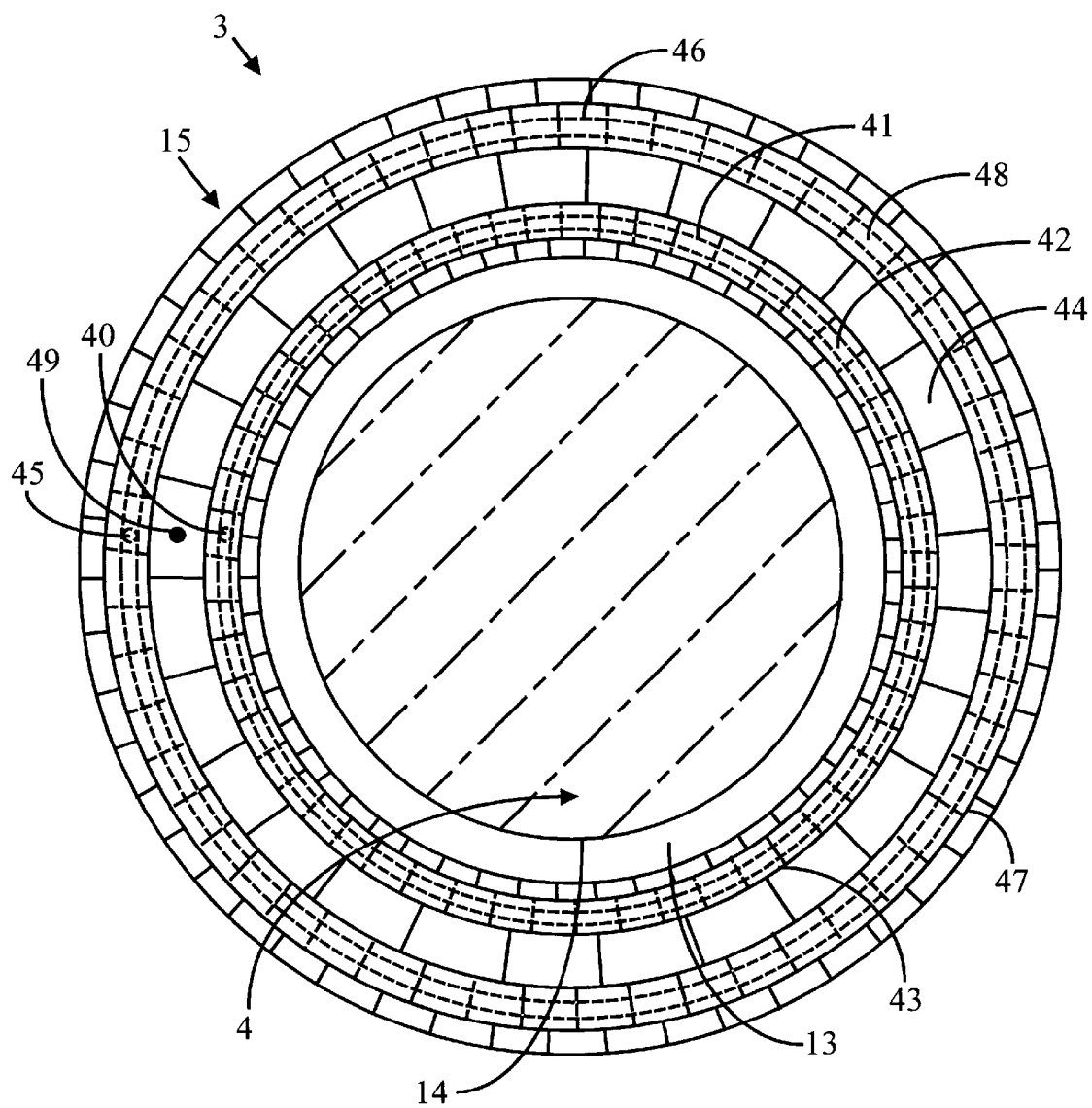
FIG. 5 is a top plan view of the stage member of FIG. 4.

FIG. 5 is a top plan view of the stage member 3 of the second embodiment of the invented apparatus, showing features previously described with respect to FIG. 4. In FIG. 5, the gas bearing 15 includes lands 42, 48 situated in respective grooves 43, 47, which are annular and concentric in configuration, and which surround the wafer substrate 14 situated on support surface 13. The channels 41, 46 are defined between surfaces of respective grooves 43, 47 and lands 42, 48 and communicate with respective inlets 40, 45. The channel 44 is defined between the lands 42, 48, and communicates with outlet 49.

The gas bearing 15 of FIGS. 4 and 5 can thus replace that of FIGS. 1–3 in an apparatus otherwise as shown in FIG. 1. The operation of the second embodiment of the apparatus 1 of FIGS. 4 and 5 is substantially the same as for the first apparatus embodiment previously described with reference to FIGS. 1–3. The regulator 24 supplies gas to inlet 40 that passes to channel 41 for distribution around the underside of the land 42. As the gas flow passes through the land 42, it is diffuses by the pores thereof and flows in relatively small streams from the land 42 between the stage and reference members. The gas streams from land 42 flow both toward the chamber 4 to substantially prevent the escape of process gas contained therein, and to the channel 44. Any process gas that does escape the chamber 4 is drawn off by channel 44 to prevent it from reaching the ambient atmosphere. The gas flow from regulator 31 flows into inlet 45 and is distributed around the underside of the land 48 via the channel 46. As the gas flow moves through the land 48, the land's pores diffuse the gas flow into small streams that flow from the land 48 into the space between the stage and reference members. The flow from the land 48 generally prevents ambient air from entering the gas bearing. Any air that does enter the bearing is drawn from channel 44 into outlet 49 and flows toward the regulator 27. The gas flows are preferably regulated by regulators 24, 27, 31 so that the gas bearing 15 generates a pressure less than ambient so that the stage member loads against the reference member's surface.

Figure 6:
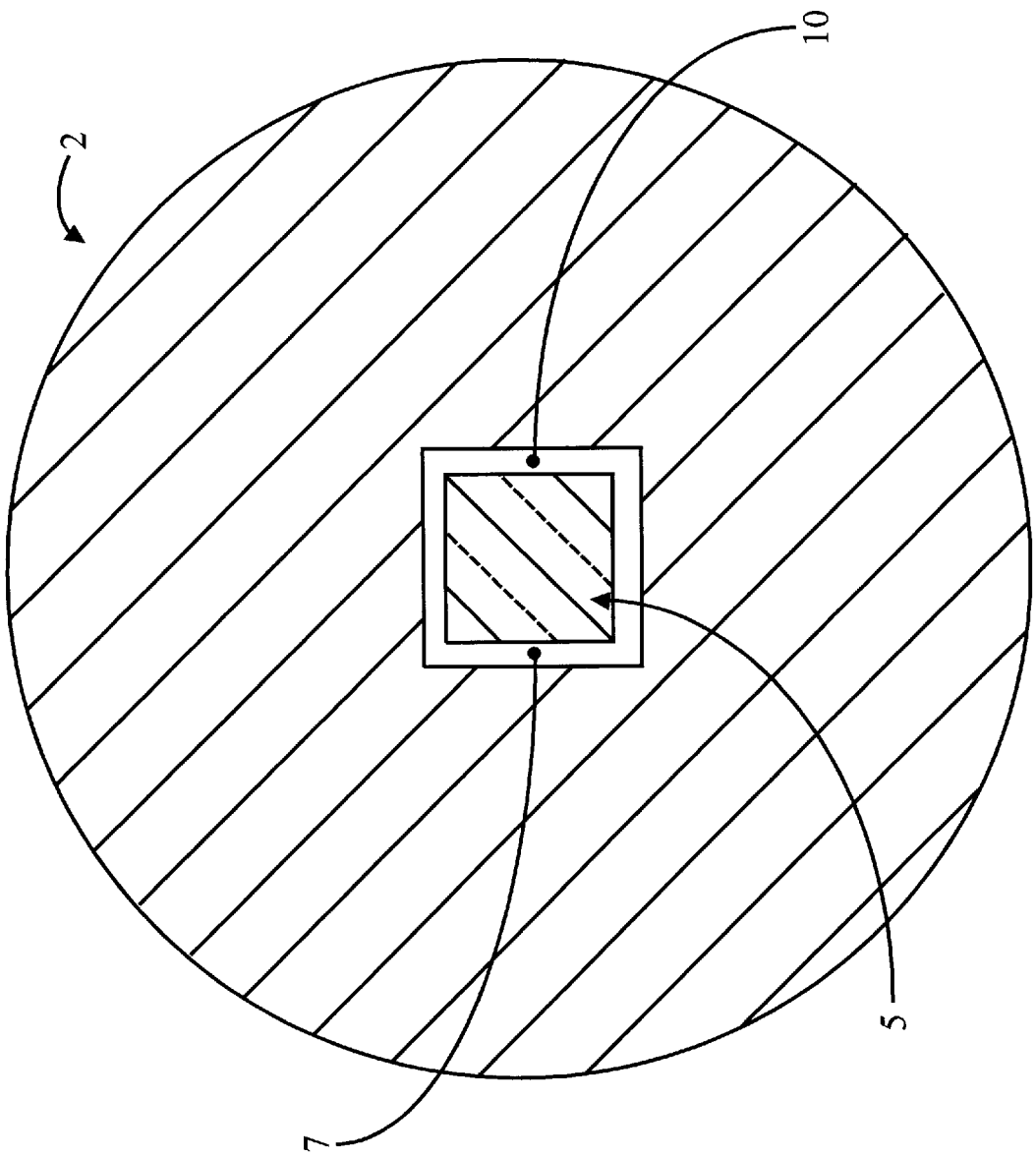
FIG. 6 is a bottom plan view of the apparatus' reference member.

FIG. 6 is a bottom plan view of the reference member 2. As was previously explained, the reference member is composed of a durable, chemically-inert material whose surface is formed with a flatness on the order of microns or less. Preferably, the surface of the reference member 2 is relatively large as compared to the opposing surface of the stage member 3 so that the stage member can be moved relative to the reference member to position the lithography projection unit 34 over any desired area of the wafer substrate 14 without having the edge of the gas bearing 15 slide past the edge of the reference member 2, a circumstance that could lead to loss of the seal and possible damage to the unfinished wafer substrate by exposure to the atmosphere in the vicinity of the apparatus 1. The window 5 is positioned in a central portion of the reference member 2. The window's exposed surface in FIG. 6 (i.e., that which directly opposes the wafer substrate when the reference and stage members are brought close together) is preferably parallel to the reference member 2, and is also preferred to be level with or lower in elevation in the perspective of FIG. 6, as compared to the flat surface of the reference member 2. By positioning the window 5 to be level with or recessed with respect to the flat surface of the reference member 2 (or, in terms of the perspectives of FIGS. 1, 2, and 4, by positioning the surface of the window that opposes the wafer substrate to be at an elevation level with or above that of the reference member's flat surface) the window can be protected from accidental contact with the stage member's lands, for example. Communicating with the space defined between the side edges of the window 5 and opposing side edges of the reference member 2, are inlet 7 and outlet 10. The positioning of the inlet 7 and outlet 10 on opposite sides of the window 5 can be beneficial in drawing process gas across the window 5 and the surface of the wafer substrate 14 when the stage and reference members are brought close together, a feature that can be used, for example, to ensure that ample process gas is available to affect the desired light-induced reaction on the wafer substrate 14.

Figure 7:
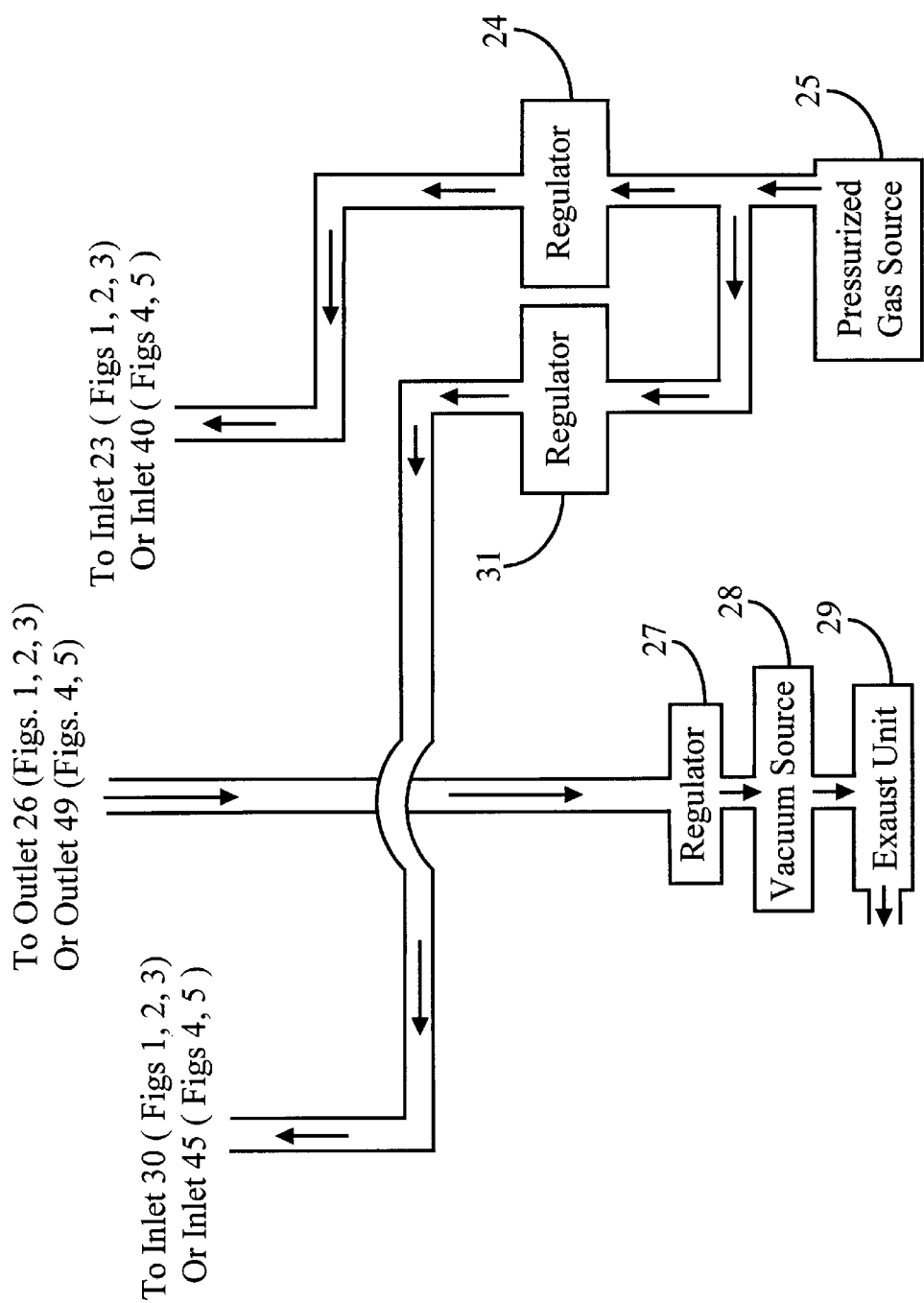
FIG. 7 is an alternative embodiment of a portion of the apparatus that can be used with either the first or second embodiments of the apparatus.

The invented apparatus can be modified in various ways without departing from the scope of the invention. For example, inlet 7 could be coupled via a valved 'Y' or divider coupling to a plurality of regulators and respective gas sources so that gases of different types, or two or more gases simultaneously, can be supplied to the chamber 4. Also, relative to FIG. 1, the gas source 32 could be omitted, and the coupling from the pressurized gas source 25 to the regulators 24 and 31 could have a 'Y' configuration, as shown in FIG. 7. In FIG. 7, the regulator 24 is coupled to the inlet 23 or 40 (FIGS. 1–3 or 4–5, respectively), and the regulator 31 is coupled to the inlet 30 or 45 (FIGS. 1–3 or 4–5, respectively). Also, the exhaust unit 29 could be omitted and the output from vacuum source 28 coupled in communication with the exhaust unit 12 for common disposal of gas flows from vacuum source 28 as well as from regulator 11. These variations are intended to fall within the scope of this invention.

A method in accordance with this invention includes a step of directing a first gas flow from a first surface toward a second surface around a first ring-like channel defined in the first surface, in which the first channel surrounds a wafer substrate situated on the first surface (see FIGS. 1–3 and 7, elements 2, 3, 15, 20, 23, 24, 25, or FIGS. 4–5 and 7, elements 2, 3, 15, 24, 25, 40, 41, 42). The first gas flow substantially contains a process gas between the first and second surfaces in proximity to the wafer substrate (see FIGS. 1 or 4, elements 2, 3, 4). The invented method also includes a step of suctioning a second gas flow from between the first and second surfaces around a second ring-like channel defined in the first surface, in which the second channel surrounds the first channel (see FIGS. 1–3 and 7, elements 2, 3, 15, 21, 26–29, and FIGS. 4–5, elements 2, 3, 15, 44, 49, 27, 28, 29). The method further includes a step of directing a third gas flow from the first surface toward the second surface around a third ring-like channel defined in the first surface, in which the third channel surrounds the second channel (see FIGS. 1–3 and 7, elements 2, 3, 15, 22, 30, 31, 25 or 32, or FIGS. 4–5 and 7, elements 2, 3, 15, 31, 25 or 32, 45, 46, 48). The third gas flow substantially prevents ambient gas from flowing by the third channel. The suctioning step draws off at least a portion of the first and third gas flows to prevent build-up of positive pressure between the first and second surfaces. Preferably, the suctioning is performed to generate a pressure sufficiently below ambient pressure to cause the first and second surfaces to load together. The contained gas can be a process gas that is sealed in containment by the first, second and third gas flows, and by the first and second surfaces. The method can include a step of introducing process gas into the volume sealed by the surfaces and gas flows, a step that can be performed by regulating the pressure at which the contained gas is introduced to the sealed volume at slightly above ambient pressure to prevent breaking of the seal established by the channel gas flows (FIG. 1, elements 7, 8, 9). The method can also include a step of exhausting the process gas from the sealed volume, a step which can be regulated at slightly below ambient pressure to prevent breaking of the seal between the first and second surfaces established by the channel gas flows (see FIG. 1, elements 10–12). The method can further include a step of irradiating the wafer substrate through a window defined in the second surface to cause the process gas to react with the wafer substrate (see FIG. 1, elements 6, 34, 36). Moreover, the irradiation step can be performed with patterned light to selectively cause a reaction, such as by reacting contained process gas with the wafer substrate (see FIG. 1, element 35). Alternatively, the irradiation step can be performed so as to uniformly irradiate the wafer substrate with light or a beam. The method can further include a step of moving the first surface relative to the second surface to successive positions, and the irradiation step can be performed after each successive movement (see FIG. 1, elements 2, 3, 33). The channel gas flows can be used in the method to maintain the first surface at a substantially constant distance from the second surface in the successive positions so that irradiated light need not be refocused upon moving the first and second surfaces relative to one another. The gas flows directed from the first and third channels can be subjected to respective diffusing steps in the method to prevent the occurrence of air hammer.

The many features and advantages of the present invention are apparent from the detailed specification and thus, it is intended by the appended claims to cover all such features and advantages of the described apparatus and method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

We claim:

1. An apparatus for containing a process gas for use in processing a substrate, the apparatus comprising:
   a reference member; and
   a stage member supporting the substrate and having a gas bearing surrounding the substrate, the gas bearing opposing the reference member and sealing the substrate and process gas in a chamber defined between the reference and stage members.

2. An apparatus as claimed in claim 1, wherein the gas bearing maintains the stage and reference members in close proximity and spaced apart from one another.

3. An apparatus as claimed in claim 2, wherein the closest spacing between the reference and stage members is in a range from 5 to 10 microns.

4. An apparatus as claimed in claim 1, wherein the gas bearing maintains substantially the same relative spacing between the reference and stage members if the stage member is moved from one position to another, relative to the reference member.

5. An apparatus as claimed in claim 1, wherein the separation between the reference member's surface and a surface of the stage member that supports the substrate, is in a range from 0.5 to 10 millimeters.

6. An apparatus as claimed in claim 1, wherein the chamber has a volume that is less than one liter.

7. An apparatus as claimed in claim 1, wherein the chamber has a volume that is less than 0.1 liter.

8. An apparatus as claimed in claim 1, wherein a surface of the reference member against which the gas bearing bears, is substantially flat.

9. An apparatus as claimed in claim 1, further comprising:
   at least one pressurized gas source;
   a vacuum source,
   the gas bearing including a plurality of lands that define first, second and third channels, the first channel surrounding the surface used to support the substrate, the second channel surrounding the first channel, and the third channel surrounding the second channel, the first and third channels coupled to communicate with the gas source, and the second channel coupled to communicate with the vacuum source.

10. An apparatus as claimed in claim 9, wherein the lands are circular and concentric in configuration.

11. An apparatus as claimed in claim 9, wherein the stage member is held in close proximity to the reference member by suction applied by the vacuum source coupled the stage member's second channel, and wherein contact between the stage member and reference member is prevented by pressurized gas applied by the gas source between the stage and reference members by the first and third channels.

12. An apparatus as claimed in claim 9, wherein the suction applied by the vacuum source and the pressure exerted by the gas sources, are proportioned so that the stage member loads against the reference member.

13. An apparatus as claimed in claim 9, wherein the gas bearing further includes
   a first porous land situated in a first groove defined in the stage member and configured to define the first channel, the first land surrounding the surface used to support the substrate; and
   a second porous land situated in a second groove defined in the stage member and configured to define the third channel, the second land surrounding the first land, and
   the second channel defined between the first and second lands.

14. An apparatus as claimed in claim 13, wherein the first and second lands are made of porous carbon.

15. An apparatus as claimed in claim 13, wherein the first and second lands are made of porous ceramic.

16. An apparatus as claimed in claim 13, wherein gaps between the lands and the reference member's surface are on the order of 5 to 10 microns.

17. An apparatus as claimed in claim 9, wherein the gas source supplies inert gas.

18. An apparatus as claimed in claim 9, wherein the gas source supplies clean dry air.

19. An apparatus as claimed in claim 9, wherein the gas source supplies gas to the first and third channels with a pressure in a range from 40 to 80 pounds per square inch.

20. An apparatus as claimed in claim 9, wherein the vacuum source draws-suction from the second channel in a range from 40 to 80 pounds per square inch.

21. An apparatus as claimed in claim 9, further comprising:
   an exhaust unit coupled in communication with the vacuum source, to dispose of gas drawn from the gas bearing.

22. An apparatus as claimed in claim 1, wherein the reference member defines an inlet communicating with the chamber, that directs process gas to the chamber.

23. An apparatus as claimed in claim 22, further comprising:
   a pressurized process gas source communicatively coupled to the inlet, for supplying the process gas to the chamber via the inlet.

24. An apparatus as claimed in claim 23, further comprising:
   a regulator communicatively coupled between the gas source and the inlet, for regulating the flow rate of process gas into the chamber.

25. An apparatus as claimed in claim 1, wherein the reference member defines an outlet communicating with the chamber, that allows exhaust gases derived from the process gas to leave the chamber.

26. An apparatus as claimed in claim 25, further comprising:
   an exhaust unit communicatively coupled to the outlet, for drawing and disposing of the exhaust gases from the chamber.

27. An apparatus as claimed in claim 26, further comprising:
   a regulator communicatively coupled between the exhaust unit and the outlet, for regulating the flow rate of exhaust gas drawn from the chamber.

28. An apparatus as claimed in claim 1, further comprising:
   a window fixed to close an aperture defined in the reference member.

29. An apparatus as claimed in claim 28, further comprising:
   a light source generating light; and
   a lithography projection unit arranged to receive the light from the light source, and directing the light through the window to the substrate.

30. An apparatus as claimed in claim 29, wherein the light is laser light.

31. An apparatus as claimed in claim 29, further comprising:
   a positioner coupled to the stage, for moving the stage member relative to the reference member so that the lithography projection unit can direct light to different areas of the substrate.

32. An apparatus as claimed in claim 28, wherein the gas bearing allows the stage member to glide along the surface of the reference member so that the window can be positioned over different areas of the substrate at a constant distance therefrom.

33. An apparatus as claimed in claim 1, wherein the gas bearing loads the stage member against the reference member.

34. An apparatus as claimed in claim 1, wherein the gas bearing allows the stage member to glide along the surface of the reference member at a substantially constant distance therefrom.

35. An apparatus as claimed in claim 1, wherein the substrate is a wafer substrate.

36. A method comprising the steps of:
a) directing a first gas flow from a first surface toward a second surface around a first ring-like channel defined in the first surface, the first channel surrounding a substrate situated on the first surface, and the first flow substantially containing a gas in proximity to the substrate;
b) suctioning a second gas flow from between the first and second surfaces around a second ring-like channel defined in the first surface, the second channel surrounding the first channel; and
c) directing a third gas flow from the first surface to the second surface around a third ring-like channel defined in the first surface, the third channel surrounding the second channel, and the third gas flow substantially preventing ambient gas from flowing by the third channel,
the second gas flow including at least a portion of the first and third gas flows.

37. A method as claimed in claim 36, further comprising the step of:
d) directing a process gas into a chamber sealed by the first, second and third gas flows and the first and second surfaces.

38. A method as claimed in claim 37, further comprising the step of:
e) regulating the pressure at which the process gas is introduced to the sealed chamber at slightly above ambient pressure.

39. A method as claimed in claim 37, further comprising the step of:
e) exhausting the process gas from the sealed chamber.

40. A method as claimed in claim 39, further comprising the step of:

e) regulating the pressure at which the process gas is exhausted from the volume at slightly below ambient pressure.

41. A method as claimed in claim 36, further comprising the steps of:
d) irradiating the substrate through a window defined in the second surface to cause the process gas to react with the substrate.

42. A method as claimed in claim 41, wherein the light is patterned to selectively to cause the process gas to react with the substrate.

43. A method as claimed in claim 41, further comprising the step of:
e) moving the first surface relative to the second surface to successive positions,
the step (d) of irradiating being performed after each successive movement in the step (e).

44. A method as claimed in claim 43, wherein the performance of said steps (a)–(c) maintains the first surface at a substantially constant distance from the second surface in the successive positions.

45. A method as claimed in claim 36, wherein the suctioning of said step (b) sufficiently balances the pressure exerted between the first and second surfaces by the first and second air flows that the first surface is loaded against the second surface.

46. A method as claimed in claim 36, wherein the performance of said steps (a)–(c) maintains the first surface at a substantially constant distance from the second surface.

47. A method as claimed in claim 36, further comprising the steps of:
d) diffusing the first flow; and
e) diffusing the second flow.

48. A method as claimed in claim 36, wherein the substrate is a wafer substrate.

* * * * *

UNITED STATES PATENT AND TRADEMARK OFFICE
CERTIFICATE OF CORRECTION

PATENT NO.    : 5,997,963
DATED         : December 7, 1999
INVENTOR(S)   : John E. Davison and Kurt W. Weiner It is certified that error appears in the above-identified patent and that said Letters Patent is hereby corrected as shown below:

Column 1,
Line 2, to be inserted after the title and before BACKGROUND OF THE INVENTION:

Government Rights
This invention was made with Government support under contract number N66001-95-C-8002 awarded by the Space and naval Warfare Systems Command, San Diego. The Government has certain rights in the invention.

Signed and Sealed this

Sixteenth Day of October, 2001

Attest:

NICHOLAS P. GODICI
Attesting Officer    Acting Director of the United States Patent and Trademark Office